US009996794B2

(12) United States Patent
Nakano et al.

(10) Patent No.: US 9,996,794 B2
(45) Date of Patent: Jun. 12, 2018

(54) RESERVOIR COMPUTING DEVICE USING EXTERNAL-FEEDBACK LASER SYSTEM

(71) Applicant: INTERNATIONAL BUSINESS MACHINES CORPORATION, Armonk, NY (US)

(72) Inventors: Daiju Nakano, Kawasaki (JP); Seiji Takeda, Kawasaki (JP); Toshiyuki Yamane, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/792,852

(22) Filed: Oct. 25, 2017

(65) Prior Publication Data

US 2018/0046909 A1    Feb. 15, 2018

Related U.S. Application Data

(63) Continuation of application No. 15/172,843, filed on Jun. 3, 2016, now Pat. No. 9,852,372.

(51) Int. Cl.
| | |
|---|---|
| *G06N 3/06* | (2006.01) |
| *G06N 3/067* | (2006.01) |
| *G06N 99/00* | (2010.01) |
| *H04Q 11/00* | (2006.01) |
| *H01S 5/026* | (2006.01) |
| *G02B 6/122* | (2006.01) |
| *G02F 1/313* | (2006.01) |
| *G02F 1/017* | (2006.01) |
| *G02F 1/015* | (2006.01) |

(52) U.S. Cl.
CPC ......... *G06N 3/0675* (2013.01); *G06N 99/005* (2013.01); *G02B 6/1225* (2013.01); *G02F 1/01708* (2013.01); *G02F 1/3136* (2013.01); *G02F 2001/0154* (2013.01); *H01S 5/026* (2013.01); *H04Q 11/0005* (2013.01); *H04Q 2011/002* (2013.01); *H04Q 2011/0026* (2013.01)

(58) Field of Classification Search
CPC .................................................... G06N 3/0675
See application file for complete search history.

(56) References Cited

U.S. PATENT DOCUMENTS

2015/0009548 A1    1/2015   Bienstman et al.

OTHER PUBLICATIONS

List of IBM Patents or Patent Applications Treated as Related dated Oct. 25, 2017, 2 pages.
Vandoorne, K. et al., "Parallel Reservoir Computing Using Optical Amplifiers" IEEE Transactions on Neural Networks (Sep. 2011) pp. 1469-1481, vol. 22, No. 9.
Dejonckheere, A. et al, "All-optical reservoir computer based on saturation of absorption" Optics Express (May 2014) pp. 1-14, vol. 22, No. 9.

*Primary Examiner* — Jerry Rahll
(74) *Attorney, Agent, or Firm* — Tutunjian & Bitetto, P.C.; Vazken Alexanian

(57) ABSTRACT

Various Reservoir Computing systems and a method performed by a Reservoir Computing system are provided. A Reservoir Computing system includes a laser for emitting light. The Reservoir Computing system further includes a mirror for reflecting external feedback light back to the laser. The Reservoir Computing system also includes a modulator for modulating the external feedback light reflected back to the laser. The Reservoir Computing system additionally includes a photo-detector for converting a laser output signal to an electrical signal.

20 Claims, 8 Drawing Sheets

RESERVOIR COMPUTING DEVICE USING EXTERNAL-FEEDBACK LASER SYSTEM

BACKGROUND

Technical Field

The present invention generally relates to computing devices, and more particularly to a reservoir computing device that uses an external-feedback laser system.

Description of the Related Art

Reservoir Computing (RC) is an emerging and promising algorithm for Neural Networks (NNs). The basic architecture of RC is nearly identical to Recurrent NN, but possesses a conspicuous feature in its learning process, namely that the weights between nodes are fixed and only the weights connected to the output layer are variable. Provided that an RC system has a strong nonlinearity, the system can be trained by modifying only a small amount of variable weights, leading to an advantage in low learning cost.

However, there is a need for a physical device implementation of RC that is easily implemented, readily scalable, reasonably sized, and not cost-prohibitive.

SUMMARY

According to an aspect of the present principles, a Reservoir Computing system is provided. The Reservoir Computing system includes a laser for emitting light. The Reservoir Computing system further includes a mirror for reflecting external feedback light back to the laser. The Reservoir Computing system also includes a modulator for modulating the external feedback light reflected back to the laser. The Reservoir Computing system additionally includes a photo-detector for converting a laser output signal to an electrical signal.

According to another aspect of the present principles, a method performed by a Reservoir Computing system is provided. The method includes emitting, by a laser, light. The method further includes reflecting, by a mirror, external feedback light back to the laser. The method also includes modulating, by a modulator, the external feedback light reflected back to the laser. The method additionally includes converting, by a photo-detector, a laser output signal to an electrical signal.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

The present principles are directed to a reservoir computing device that uses an external-feedback laser system.

In an embodiment, the present principles realize a physical reservoir computing system that works by non-linear interaction between a laser and a feedback light. In an embodiment, the RC system is implemented by Silicon Photonics (SiPh) technology (with attendant lower cost). In an embodiment, the RC system is designed by deterministic theory for ease of operation design.

As used herein, the term "reservoir" denotes a semiconductor laser and an external mirror.

Figure 1:
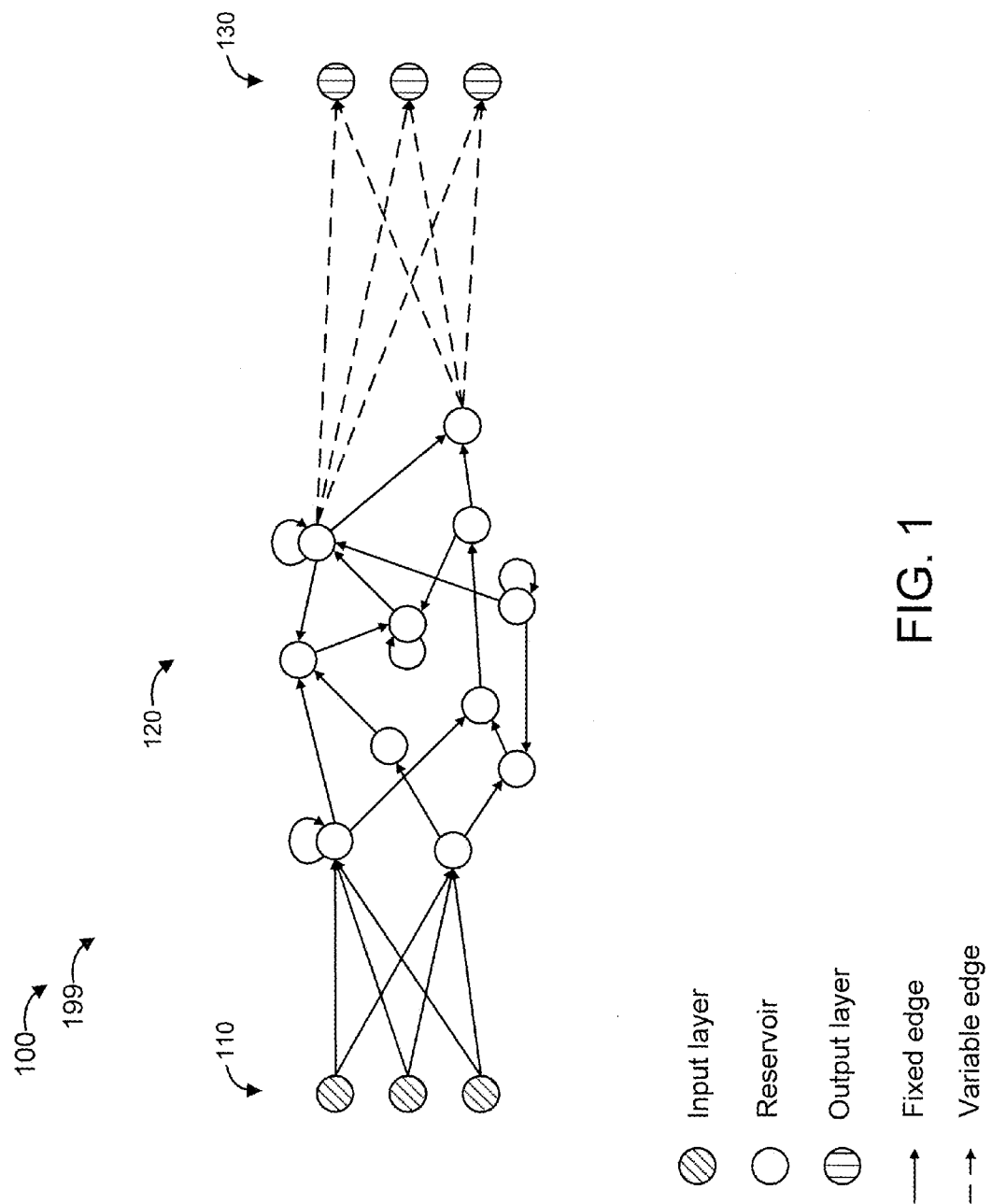
FIG. 1 shows an exemplary conceptual representation of a Reservoir Computing (RC) system to which the present principles can be applied, in accordance with an embodiment of the present principles.

FIG. 1 shows an exemplary conceptual representation 199 of a Reservoir Computing (RC) system 100 to which the present principles can be applied, in accordance with an embodiment of the present principles.

The RC system 100 includes an input layer 110, a reservoir 120, and an output layer 130. Fixed edges (weights) are shown using solid lines, while variable edges (weights) are shown using dashed lines. As is evident, only the edges (weights) connected to the output layer 130 are variable.

Figure 2:
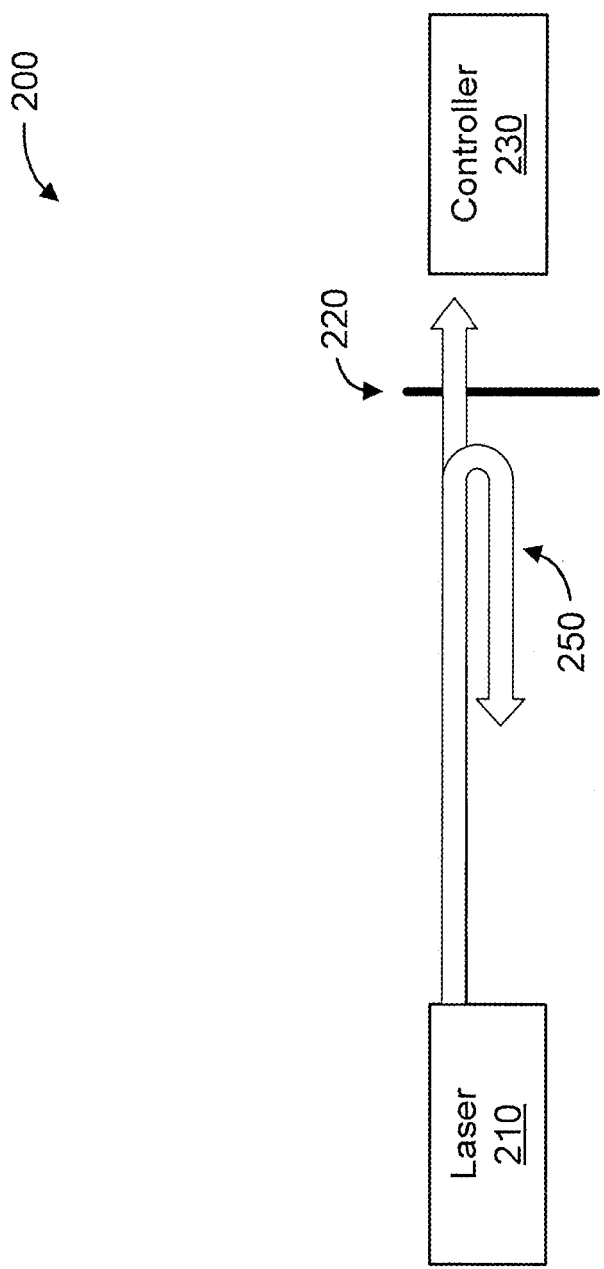
FIG. 2 shows an exemplary conceptual representation of a Reservoir Computing (RC) system, in accordance with an embodiment of the present principles.

FIG. 2 shows an exemplary conceptual representation 299 of a Reservoir Computing (RC) system 200, in accordance with an embodiment of the present principles.

Figure 3:
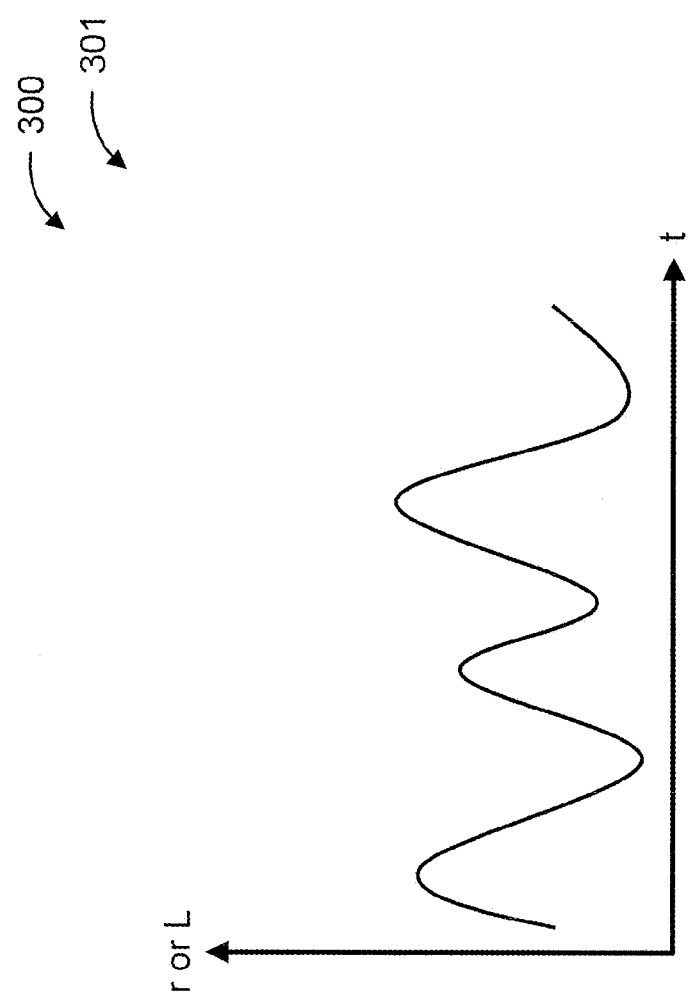
FIG. 3 shows an exemplary input signal to the RC system of FIG. 2, in accordance with an embodiment of the present principles.

FIG. 3 shows an exemplary input signal 300 to the RC system 200 of FIG. 2, in accordance with an embodiment of the present principles. The input signal 300 is depicted in a plot 301 of reflectivity r or external cavity length L (on the y-axis) versus time (on the x-axis).

Figure 4:
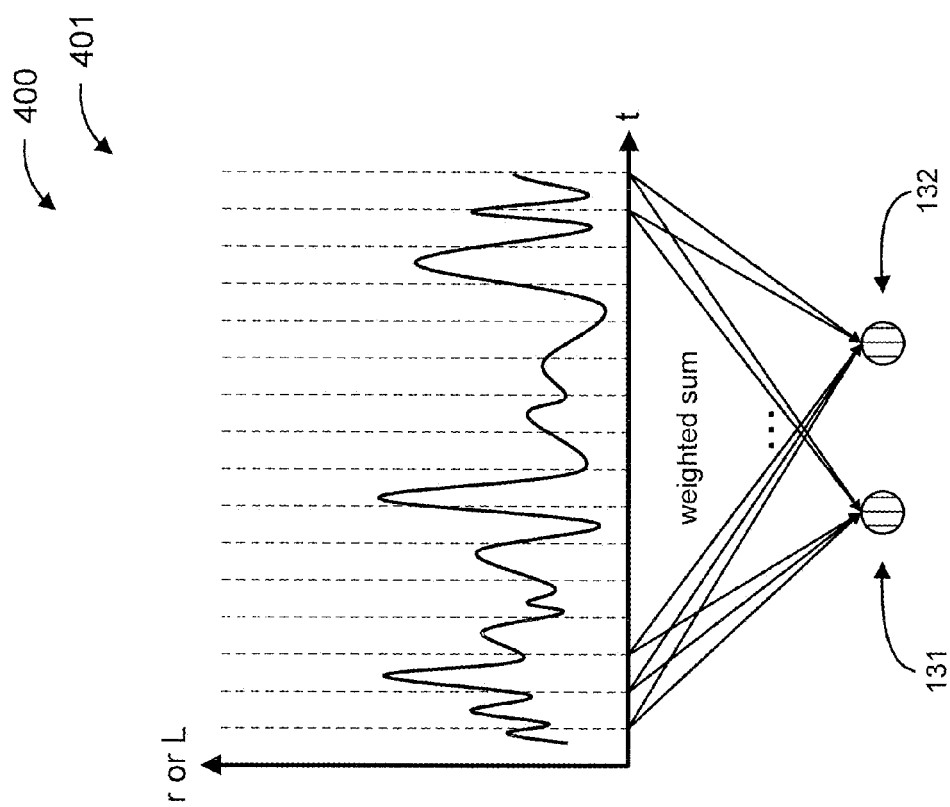
FIG. 4 shows an exemplary output signal from the RC system of FIG. 2, in accordance with an embodiment of the present principles.

FIG. 4 shows an exemplary output optical signal 400 from the RC system 200 of FIG. 2, in accordance with an embodiment of the present principles. The output signal 400 is depicted in a plot 401 of reflectivity r or external cavity length L (on the y-axis) versus time (on the x-axis). Also shown in FIG. 4 are some of output nodes 131 and 132 from the output layer 130 shown with respect to FIG. 1.

The RC system 200 includes a laser 210, an external mirror 220, and a controller 230. The input signal 300 to the RC system 200 is provided by modulating mirror reflectivity or laser-mirror distance.

The laser 210 is a semiconductor laser whose nonlinear dynamics are caused by external feedback light provided by the external mirror 220. The nonlinear dynamics realizes a nonlinear mapping of the input signal 300 to the output signal 400.

The semiconductor laser 210 oscillates under constant carrier injection, being perturbed by an external feedback light 250. It is desirable that the reservoir (elements 210 and 220) exhibits strong nonlinearity that is caused by appropriate carrier injection rate and feedback strength.

The input electric signal 300 modulates (1) reflectivity of external mirror, or, (2) an external cavity length (distance between laser and external mirror) by a SiPh-based mechanism described hereinafter.

The optical output power is sampled by the controller 230 and the signal intensity at each sample time is regarded as the output from the reservoir. A weighted sum of the signal at each time is fed into the output nodes 131 and 132 (e.g., sigmoid functions) by the controller 230, and the weights are updated by the controller 230 referring to training data. The controller 230 can be, for example, but is not limited to, a Field-Programmable Gate Array (FPGA), an Application-Specific Integrated Circuit (ASIC), a Central Processing Unit (CPU), and so forth.

The above approach can be applied to waveform classification, function approximation, regression, and so forth.

The above approach operates with constant laser emission beyond lasing threshold, therefore the behavior is described by deterministic equations as will be described in working example.

To keep the RC system 200 appropriately nonlinear, a threshold-normalized carrier injection rate J/Jth of the laser 210 is desired to be in 1.0<J/Jth<2.0.

Figure 5:
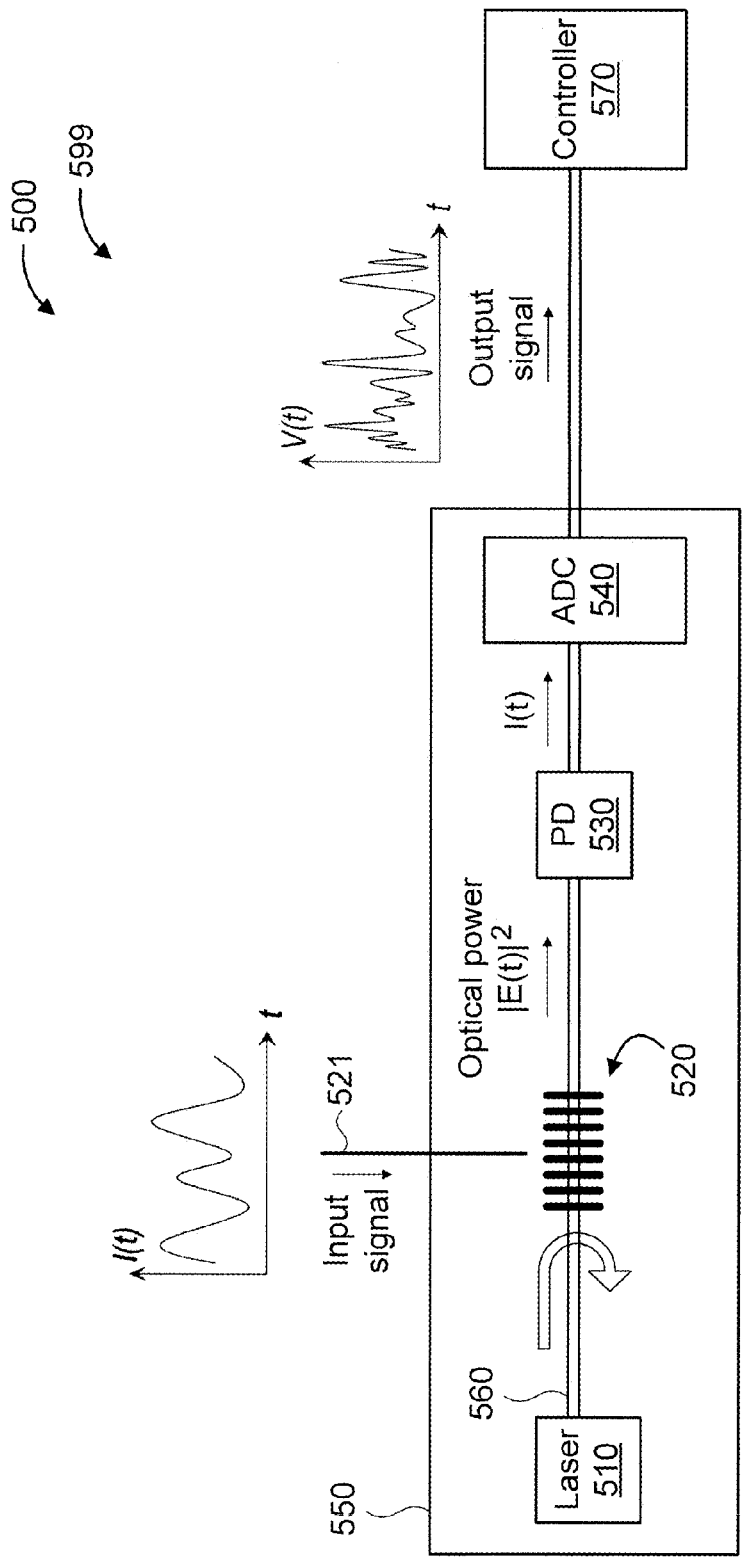
FIG. 5 shows an exemplary implementation of a Reservoir Computing (RC) system whose input is provided based on modulated mirror reflectivity, in accordance with an embodiment of the present principles.

FIG. 5 shows an exemplary implementation 599 of a Reservoir Computing (RC) system 500 whose input is provided based on modulated mirror reflectivity, in accordance with an embodiment of the present principles.

The RC system 500 includes a Distributed Feedback (DFB) laser 510, a Silicon waveguide 560, a Distributed Bragg Reflector (DBR) mirror 520, a Photo Detector (PD) 530, an Analog-to-Digital Converter (ADC) 540, all integrated on a Silicon Photonics (SiPh) chip 550 (e.g., on a substrate thereof). Moreover, RC system 500 further includes a controller 570. The controller 570 can be implemented on-chip or off-chip, depending upon the implementation.

The DBR mirror 520 has a P/N junction. The reflection spectrum of the DBR mirror 520 is tunable by modulating the refractive index by carrier injection.

The DFB laser 510 oscillates by temporally constant carrier injection. The Silicon waveguide 560 guides laser emission.

The input waveform (i.e., electric current variation), provided via an electric line 521, modulates the refractive index of the DBR mirror 520, meaning, the reflection spectrum of the mirror 520. The refractive index of the DBR 520 can be modulated using, e.g., a non-linear optical effect such as the Kerr Effect (aka quadratic electro-optic effect). The electric line 521 can be considered a modulator of the mirror 520 since a modulating input waveform is received via the electric line 521 that modulates the refractive index of the mirror 520.

The optical output power ($|E(t)|^2$) is converted to an electric current (I(t)) by the PD 530, then converted to a digital signal (V(t)) by the ADC 540.

The intensity of digital waveform at each time is sampled and weighted-summed by the controller 570 (e.g., a FPGA, an ASIC, a CPU, etc.). The weighted-summed values are compared by the controller 570 with training signals to update the weights connected to the output layer.

Implementation 599 can receive analog signals as input. Thus, system 500 is suitable for analog signal processing applications such as, for example, but not limited to, voice/speaker recognition, speech recognition, moving object recognition, anomaly detection, and time-series prediction.

Figure 6:
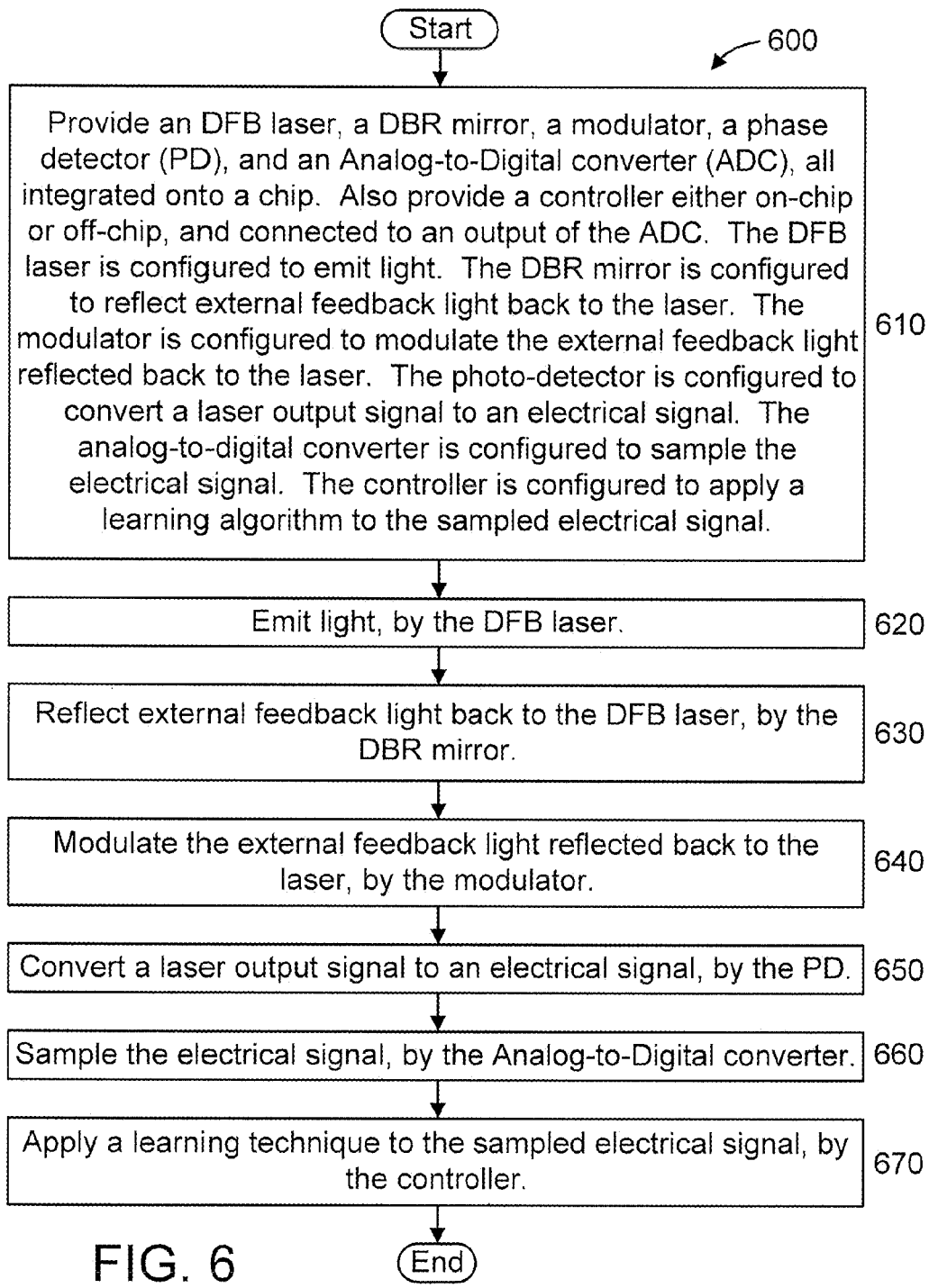
FIG. 6 shows an exemplary method for providing and operating a Reservoir Computing system whose input is provided based on modulated mirror reflectivity, in accordance with an embodiment of the present principles.

FIG. 6 shows an exemplary method 600 for providing and operating a Reservoir Computing system whose input is provided based on modulated mirror reflectivity, in accordance with an embodiment of the present principles.

At step 610, provide a DFB laser, a DBR mirror, a modulator, a phase detector (PD), and an Analog-to-Digital converter (ADC), all integrated onto a chip (e.g., a Silicon photonics chip). Also provide a controller either on-chip or off-chip, and connected to an output of the ADC. The DFB laser is configured to emit light. The DBR mirror is configured to reflect external feedback light back to the laser. The modulator is configured to modulate the external feedback light reflected back to the laser. The photo-detector is configured to convert a laser output signal to an electrical signal. The analog-to-digital converter is configured to sample the electrical signal. The controller is configured to apply a learning algorithm to the sampled electrical signal.

At step 620, emit light, by the DFB laser.

At step 630, reflect external feedback light back to the DFB laser, by the DBR mirror.

At step 640, modulate the external feedback light reflected back to the laser, by the modulator.

At step 650, convert a laser output signal to an electrical signal, by the PD.

At step 660, sample the electrical signal, by the Analog-to-Digital converter.

At step 670, apply a learning technique to the sampled electrical signal, by the controller. In an embodiment, the learning technique can use linear regression, a neural network, a pseudo-inverse matric, and so forth. In an embodiment, the learning technique can be any of, a classifier, a decoder, a speech recognizer, a speaker recognizer, a bit processor, and so forth.

Figure 7:
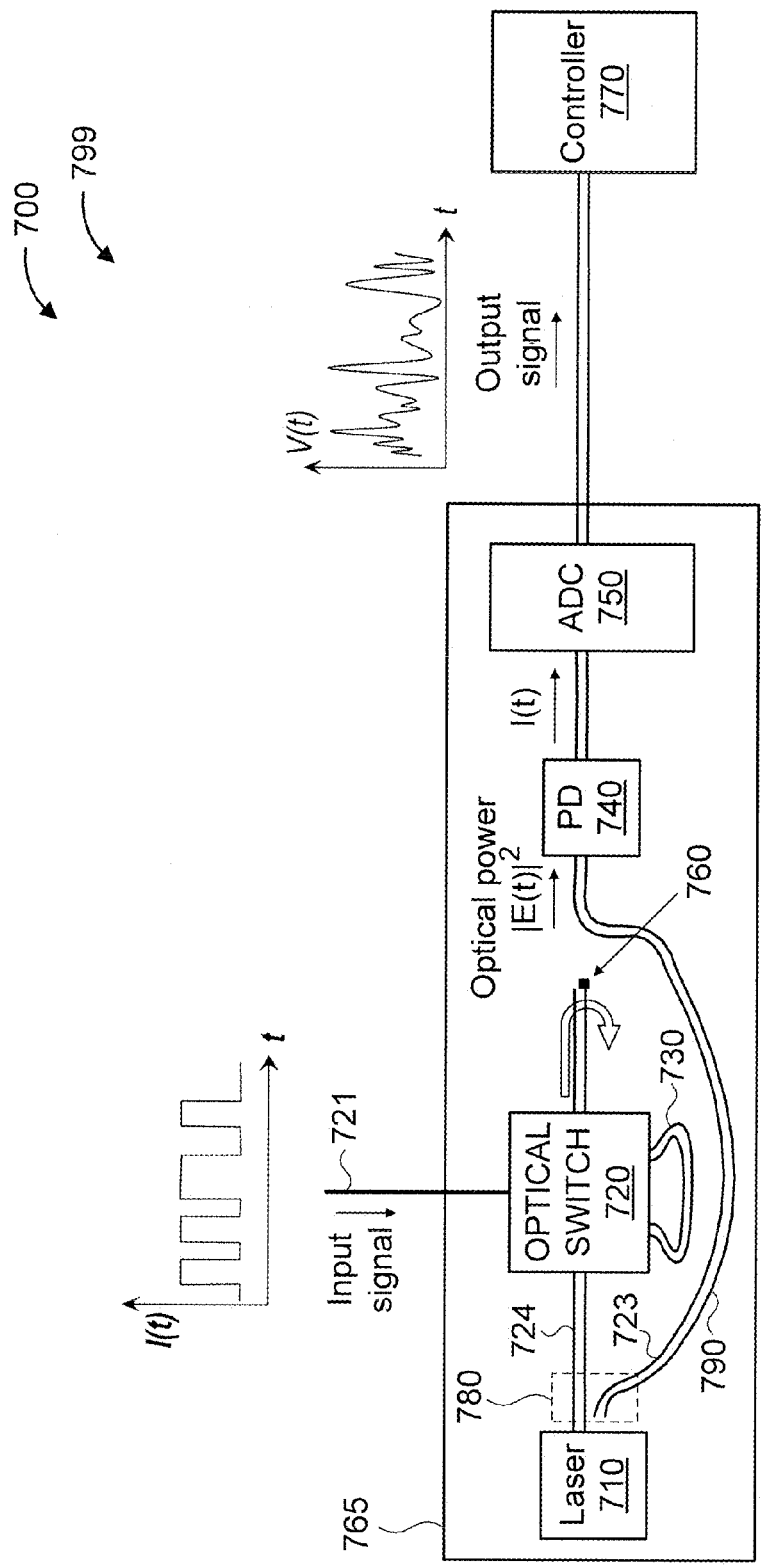
FIG. 7 shows an exemplary implementation of a Reservoir Computing (RC) system whose input is provided based on modulated distance, in accordance with an embodiment of the present principles.

FIG. 7 shows an exemplary implementation 799 of a Reservoir Computing (RC) system 700 whose input is provided based on modulated distance (between a laser and a mirror), in accordance with an embodiment of the present principles.

The RC system 700 includes a Distributed Feedback (DFB) laser 710, an optical switch 720, an optical delay loop 730, a Photo Detector (PD) 740, and an Analog-to-Digital Converter (ADC) 750, all integrated on a Silicon Photonics (SiPh) chip 765. Moreover, RC system 700 further includes an "external mirror" (a waveguide edge) 760, a controller 770, a directional coupler 780, and a Silicon waveguide 790.

The optical switch 720 can include a Mach-Zehnder interferometer.

The DFB laser 710 oscillates by temporally constant carrier injection. The Silicon waveguide 790 guides laser emission.

The input waveform, provided via an electric line 721, is binary signal such as bit train. Binary electric current (i.e., carrier injection) switches the output ports of the optical switch 720. One port 723 directly reaches the external mirror 760, and the other port 724 reaches the external mirror 760 via the optical delay loop 730, therefore the external cavity length temporally varies with the binary pattern following the input signal. The optical switch 720 can be considered a (length-based) modulator since the effective optical path length from the laser to the mirror 760 changes based upon which of multiple paths are selected by the optical switch 720.

The optical output power ($|E(t)|^2$) is converted to electric current by the PD 740, then converted to a digital signal by the ADC 750.

The intensity of the digital waveform at each time is sampled and weighted-summed by the controller 770 (e.g., a FPGA, an ASIC, a CPU, etc.). The weighted-summed values are compared by the controller 770 with training signals to update the weights connected to the output layer.

Implementation 700 can receive binary waveforms as input. Thus, system 700 is suitable for bit signal processing.

Figure 8:
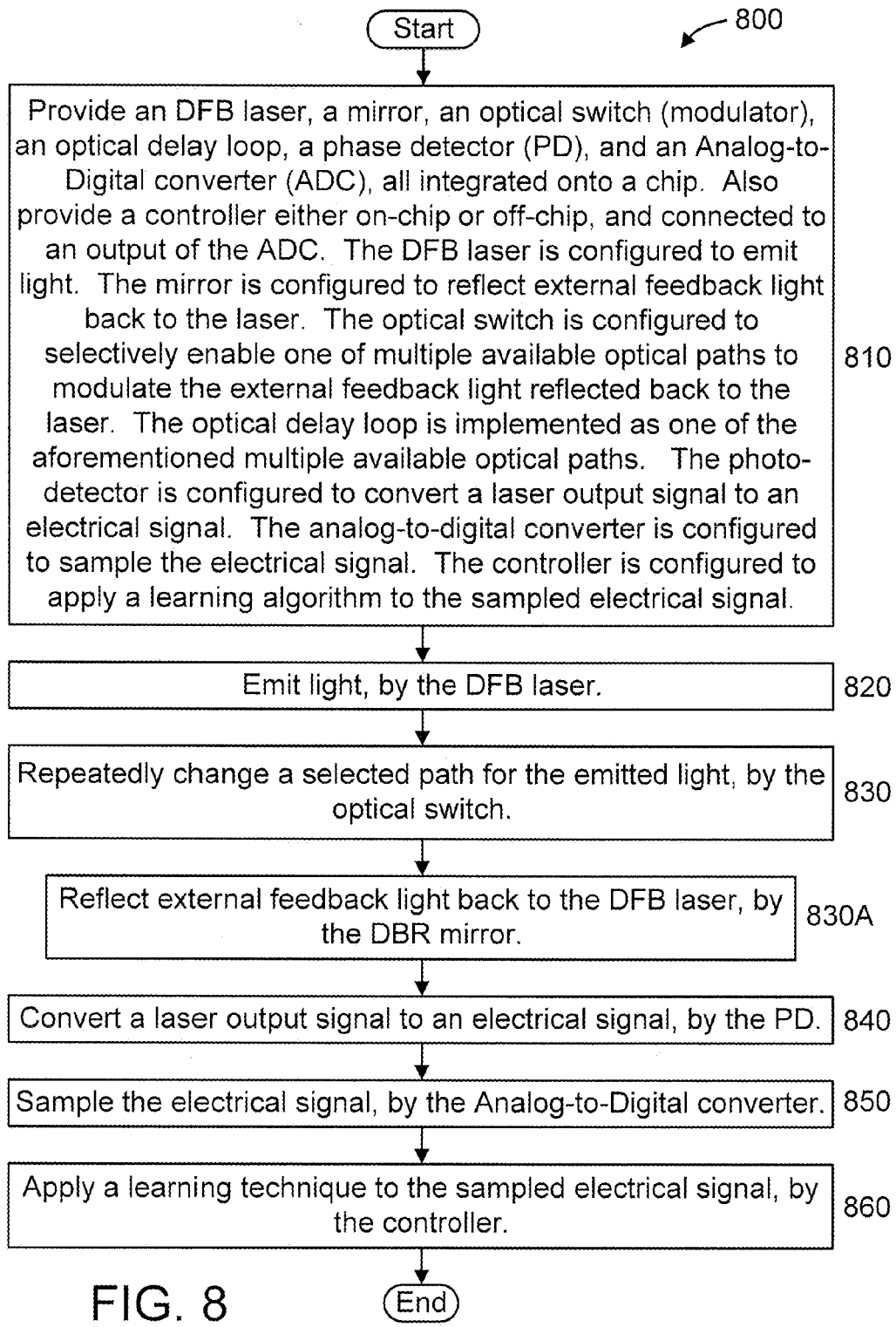
FIG. 8 shows an exemplary method for providing and operating a Reservoir Computing system whose input is provided based on modulated distance, in accordance with an embodiment of the present principles.

FIG. 8 shows an exemplary method 800 for providing and operating a Reservoir Computing system whose input is provided based on modulated distance (between a laser and a mirror), in accordance with an embodiment of the present principles.

At step 810, provide an DFB laser, a mirror, an optical switch (modulator), an optical delay loop, a photo detector (PD), and an Analog-to-Digital converter (ADC), all integrated onto a chip (e.g., a Silicon photonics chip). Also provide a controller either on-chip or off-chip, and connected to an output of the ADC. The DFB laser is configured to emit light. The mirror is configured to reflect external feedback light back to the laser. The optical switch is configured to selectively enable one of multiple available optical paths (each having a different effective optical path length between the laser and the mirror) to modulate the external feedback light reflected back to the laser. The optical delay loop is implemented as one of the aforementioned multiple available optical paths. The photo-detector is configured to convert a laser output signal to an electrical signal. The analog-to-digital converter is configured to sample the electrical signal. The controller is configured to apply a learning algorithm to the sampled electrical signal.

At step 820, emit light, by the DFB laser.

At step 830, repeatedly change a selected path for the emitted light, by the optical switch (so as to modulate the effective path length from the laser to the PD).

In an embodiment, step 830 includes step 830A.

At step 830A, reflect external feedback light back to the DFB laser, by the mirror. It is to be noted that when path 724 is selected, then step 830A comes into play as the mirror 760 is located within/on that path. In contrast, when path 723 is selected, then step 830A does not come into play (see, FIG. 7).

At step 840, convert a laser output signal to an electrical signal, by the PD.

At step 850, sample the electrical signal, by the Analog-to-Digital converter.

At step 860, apply a learning technique to the sampled electrical signal, by the controller. In an embodiment, the learning technique can use linear regression, a neural network, a pseudo-inverse matric, and so forth. In an embodiment, the learning technique can be any of, a classifier, a decoder, a speech recognizer, a speaker recognizer, a bit processor, and so forth.

A description will now be given regarding a working example of an implementation of the present principles, in accordance with an embodiment of the present principles.

We demonstrated the operability of the reservoir as a classifier by utilizing Lang-Kobayashi equation, which describes laser dynamics under external optical feedback. In the demonstration, the working example is directed to the case of modulating mirror reflectivity.

In an actual case, the DBR mirror reflectivity can be modulated from 0 to 1. However, in the working example, the DBR mirror reflectivity was modulated from 0.4 to 0.8 in consideration of low-power operation. The distance from laser to mirror is assumed to be 1 mm.

In the working example, the task to solve is classification of sine or triangular waveform which are given as input signal. Sampled optical output power is fed into 2 bit nodes as a weighted sum. At those two nodes, training data are given as 01 for sine waveforms and 10 for triangular waveforms to modify weights.

In the working example, 500 training data (250 sine and 250 triangular) were fed into the system. Each data has a different wavelength randomly distributing from 0-50% around the central wavelength. It was confirmed the input signal (sine or triangular waveform) is nonlinearly mapped onto temporal axis. The former part of the output signal were neglected and only the latter part was used for learning. After the above learning process, the capability of classification were tested by 100 test data. It was confirmed that a 97% classification rate was achieved. For comparison, we also performed the same training for an input signal without passing through the reservoir, and confirmed a 71% classification rate, thus exhibiting the superiority of the reservoir in accordance with the present principles.

The present invention may be, include, and/or otherwise involve a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A Reservoir Computing system, comprising:
a laser for emitting light;
a mirror for reflecting external feedback light back to the laser;
a modulator for modulating the external feedback light reflected back to the laser; and
a photo-detector for converting a laser output signal to an electrical signal.

2. The Reservoir Computing system of claim 1, wherein the modulator modulates the external feedback light by changing a reflectivity of the mirror.

3. The Reservoir Computing system of claim 2, wherein the reflectivity of the mirror is changed by modulating a refractive index of the mirror using a non-linear optical effect.

4. The Reservoir Computing system of claim 2, wherein the reflectivity of the mirror is changed by modulating a refractive index of the mirror based on electric current variation.

5. The Reservoir Computing system of claim 1, wherein the mirror comprises a Distributed Bragg Reflector.

6. The Reservoir Computing system of claim 1, wherein the modulator modulates the external feedback light by changing an effective optical path length between the laser and the photo detector.

7. The Reservoir Computing system of claim 6, wherein the modulator comprises an optical switch for selectively enabling one of multiple available optical paths, each having a different effective optical path length between the laser and the photo detector.

8. The Reservoir Computing system of claim 7, wherein the optical switch comprises a Mach-Zehnder interferometer.

9. The Reservoir Computing system of claim 7, wherein at least one of the multiple available optical paths comprises an optical delay loop.

10. The Reservoir Computing system of claim 1, further comprising an optical waveguide for guiding the laser output signal.

11. The Reservoir Computing system of claim 1, wherein the optical waveguide comprises a photonic crystal.

12. The Reservoir Computing system of claim 1, wherein the laser is a distributed feedback laser, and the laser, the mirror, the modulator, and the photo-detector are integrated on a Silicon photonics chip.

13. The Reservoir Computing system of claim 1, wherein the laser is a semiconductor laser.

14. The Reservoir Computing system of claim 1, wherein the laser operates at a pump power that is above a lasing threshold of the laser and below two times a pumping rate of the laser.

15. The Reservoir Computing system of claim 1, wherein the laser is a non-semiconductor laser.

16. The Reservoir Computing system of claim 1, further comprising a controller for applying a learning algorithm to the electrical signal.

17. A method performed by a Reservoir Computing system, the method comprising:
emitting, by a laser, light;
reflecting, by a mirror, external feedback light back to the laser;
modulating, by a modulator, the external feedback light reflected back to the laser; and
converting, by a photo-detector, a laser output signal to an electrical signal.

18. The method of claim 17, wherein said modulating step modulates the external feedback light by changing a reflectivity of the mirror.

19. The method of claim 18, wherein the reflectivity of the mirror is changed by modulating a refractive index of the mirror using a non-linear optical effect.

20. The method of claim 18, wherein the reflectivity of the mirror is changed by modulating a refractive index of the mirror based on electric current variation.

* * * * *